United States Patent
Burrows et al.

(10) Patent No.: US 7,592,043 B2
(45) Date of Patent: *Sep. 22, 2009

(54) METHOD AND APPARATUS FOR COATING A PATTERNED THIN FILM ON A SUBSTRATE FROM A FLUID SOURCE WITH CONTINUOUS FEED CAPABILITY

(75) Inventors: Paul E. Burrows, Kennewick, WA (US); Linda S. Sapochak, Kennewick, WA (US)

(73) Assignee: Battelle Memorial Institute, Richland, WA (US)

( * ) Notice: Subject to any disclaimer, the term of this patent is extended or adjusted under 35 U.S.C. 154(b) by 739 days.

This patent is subject to a terminal disclaimer.

(21) Appl. No.: 11/057,905

(22) Filed: Feb. 14, 2005

(65) Prior Publication Data

US 2005/0227004 A1 Oct. 13, 2005

Related U.S. Application Data

(63) Continuation-in-part of application No. 10/685,891, filed on Oct. 14, 2003, now abandoned.

(51) Int. Cl.
*C23C 16/00* (2006.01)
(52) U.S. Cl. .............. 427/248.1; 427/255.23; 427/255.25; 427/255.395; 427/255.6; 427/255.7
(58) Field of Classification Search .......... 427/248.1, 427/255.23, 255.25, 255.395, 255.6, 255.7
See application file for complete search history.

(56) References Cited

U.S. PATENT DOCUMENTS

| | | | | |
|---|---|---|---|---|
| 4,954,371 A | * | 9/1990 | Yializis | 427/497 |
| 5,393,564 A | * | 2/1995 | Westmoreland et al. | 427/248.1 |
| 6,177,151 B1 | * | 1/2001 | Chrisey et al. | 427/596 |
| 6,521,324 B1 | * | 2/2003 | Debe et al. | 156/235 |
| 2005/0079278 A1 | * | 4/2005 | Burrows et al. | 427/69 |

* cited by examiner

*Primary Examiner*—Binh X Tran
(74) *Attorney, Agent, or Firm*—Douglas McKinley, Jr.

(57) ABSTRACT

A method and apparatus for forming patterned coatings of thin film, non-polymerizable compounds on a substrate. A mixture of the non-polymerizable compound and a liquid carrier is pumped into the interior of a heated evaporation box having an internal temperature sufficient to convert substantially all of the non-polymerizable compound and liquid carrier to a gaseous form. The non-polymerizable compound and liquid carrier are then removed from the evaporation box via exit slit in the evaporation box. Adjacent to the exit slit, and maintained in a vacuum, is a first substrate upon which the non-polymerizable compound condenses. The first substrate is in motion, for example on a web roller, thereby allowing a continuous coating of the non-polymerizable compound to be applied to the first substrate. Once the non-polymerizable compound is applied to one side of the first substrate, an energy source is then directed toward the opposite side of the first substrate. In this manner, a portion of the non-polymerizable compound is removed from the first substrate. A second substrate is then provided adjacent to the first substrate, and the non-polymerizable compound is thereby transferred from the first substrate onto the second substrate. By repeatedly transferring portions of the non-polymerizable material from the first substrate to the second substrate in this manner, the thin film, non-polymerizable materials can be formed onto the second substrate in a predetermined pattern, and in a continuous and highly efficient process.

14 Claims, 3 Drawing Sheets

METHOD AND APPARATUS FOR COATING A PATTERNED THIN FILM ON A SUBSTRATE FROM A FLUID SOURCE WITH CONTINUOUS FEED CAPABILITY

CROSS-REFERENCE TO RELATED APPLICATIONS

This application is a continuation in part of U.S. Ser. No. 10/685,891, filed Oct. 14, 2003, now abandoned.

STATEMENT REGARDING FEDERALLY SPONSORED RESEARCH OR DEVELOPMENT

This invention was made with U.S. Government support under Contract DE-AC05-76RL01830 awarded by the U.S. Department of Energy. The U.S. Government has certain rights in the invention.

BACKGROUND OF THE INVENTION

As a result of the broad use of thin films across a wide variety of industrial applications, a tremendous amount of research has been conducted towards the development of thin film materials and methods for their manufacture in a cost effective manner. One example of such materials is small molecule organic semiconductors, which are currently under development for a number of applications, including displays, transistors and memories. U.S. Ser. No. 10/685,891, filed Oct. 14, 2003, the entire contents of which are hereby incorporated herein by this reference, describes a method and apparatus for depositing these materials in a high quality, low cost, manner with high throughput. In many of these applications, however, it desirable to provide not only a high quality, low cost, and high throughput deposition system, but also to provide a deposition system that provides these materials on a substrate in a predetermined pattern. For example, and not meant to be limiting, in display applications, it is highly desirable to deposit thousands, if not millions, of individual, discrete, uniform spots, termed pixels, each of which can be individually addressed by a controlling circuit. Unfortunately, such a system does not currently exist.

Conventional physical vapor deposition techniques or spin coating, although effective for small area, high value-added applications, are too slow to be cost effective for high throughput manufacturing, and further do not result in a patterned film. Organic vapor phase deposition using low vacuum and shower-head type geometries derived from the chemical vapor deposition industry have not been proven capable of the high deposition rates required for roll-to-roll fabrication. While printing techniques are amenable to pattern formation, they also tend to be too slow and generally restricted to batch manufacturing. Post-deposition patterning is difficult for organic materials due to incompatibility with photoresist chemicals, therefore most patterned organic thin films are made by depositing the film through a stencil mask in a batch process.

Other high speed deposition techniques include polymer multilayer deposition (PML), which is well-known for making uniform thin films of acrylate-based polymers. In general, the PML process has two forms evaporative and non-evaporative. Each begins by degassing the working monomer, which is a reactive organic liquid. In the evaporative process, the monomer is metered through an ultrasonic atomizer into a hot tube where it flash evaporates and exits through a nozzle as a monomer gas. The monomer gas then condenses on the substrate as a liquid film that is subsequently cross-linked to a solid polymer by exposure to UV radiation or an electron beam. In the non-evaporative process, the degassed liquid monomer is extruded through a slotted die orifice onto the substrate. It is then cross-linked in the same fashion as in the evaporative process. Salts, graphite or oxide powders, and other nonvolatile materials can be deposited in a homogeneous mixture with the monomer. Such mixtures cannot be flash evaporated, but are required for electrolyte, anode, cathode, and capacitor film layers. The evaporative process has been shown to produce thicknesses up to approximately 10 microns at speeds as great as 1000 feet per minute. The non-evaporative process have been shown to deposit thicknesses from 10 microns to about 50 mils at substrate speeds approaching several hundred feet per minute. Unfortunately, the polymeric materials amenable to PML deposition are electrically inert, and although it is possible to incorporate guest molecules into the PML flux, it is difficult to achieve a high enough loading of active material to create efficient semiconductors. A high throughput, continuous technique for small molecule semiconductors, combined with a patterning technique that also operates in a continuous manner, is thus needed to provide a viable route to high volume production of these non-polymeric materials, such as semiconductors, patterned on substrates.

BRIEF SUMMARY OF THE INVENTION

Accordingly, it is an object of the present invention to provide a method for patterned coating of thin film, non-polymeric compounds, on a substrate. The method of the present invention is similar to PML techniques, with several key differences. One such key difference is related to the difference between PML coatings, which are generally made up of polymerized monomer materials which are readily delivered in a liquid form to an ultrasonic nozzle directed into a flash evaporation box, and the non-polymeric compounds which ultimately form the coatings of the present invention, such as, by way of example, organic semiconductors. The coatings of the present invention, which may be one or more organic materials, one or more inorganic materials, or combinations thereof, are not readily evaporated in the manner PML coatings are evaporated. To overcome this difference, the present invention provides a mixture of the non-polymeric compound and a liquid carrier. This mixture is then pumped into the interior of a heated evaporation box having an internal temperature sufficient to convert substantially all of the non-polymeric compound and liquid carrier to a gaseous form. The non-polymeric compound and liquid carrier are then removed from the evaporation box via exit slit in the evaporation box. Adjacent to the exit slit, and maintained in a vacuum, is a first substrate upon which the non-polymeric compound condenses. The first substrate is in motion, for example on a web roller, thereby allowing a continuous coating of the non-polymeric compound to be applied to the first substrate.

Once the non-polymeric compound is applied to one side of the first substrate, an energy source is then directed toward the opposite side of the first substrate. In this manner, a portion of the non-polymeric compound is removed from the first substrate. A second substrate is then provided adjacent to the first substrate, and the portion of the non-polymeric compound is thereby transferred from the first substrate onto the second substrate. By repeatedly transferring portions of the non-polymeric material from the first substrate to the second substrate in this manner, the thin film, non-polymeric materials can be formed onto the second substrate in a predetermined pattern, and in a continuous and highly efficient process. The first substrate is therefore a sacrificial substrate and may be a low cost, thin polymer or metal foil which can be disposed of or recycled. The working device is built on the second substrate which can either be a flexible foil or a series of rigid plates. A complex multilayer system can be built up by repeated application of the described process using different non-polymeric materials, or by application of the described process onto a substrate which already contains thin films deposited by other techniques such as conventional vacuum deposition, sputtering or solution-coating. The term "second substrate" should therefore be understood to encompass all the previously described possibilities.

The first and second substrates may be in close proximity, or in direct in physical contact when the portion of the non-polymeric compound is removed from the first substrate and deposited on the second substrate. To provide a continuous process, the first and second substrates may be selected as flexible substrates on a web roller, one or more discrete substrates on rigid plates, and combinations thereof. The non-polymeric compound can be an organic, an inorganic material, or mixtures thereof. Preferably, the non-polymeric compound and liquid carrier mixture is atomized into a fine spray inside of the evaporation box, by first agitating the mixture in a source reservoir before introducing the mixture to the evaporation box. Agitation can be by any suitable method, including without limitation, ultrasonic agitation, mechanical vibration, magnetic stirring, and combinations thereof.

To assist the release of the thin film, non-polymeric materials from the first substrate, a release layer may be provided on the first substrate. A release layer is any material coated on the first substrate that facilitates the release of the non-polymeric compound from the first substrate when exposed to the energy source. Preferred energy sources include, but are not limited to, lasers, high intensity lights, focused light sources, a mechanical device configured to strike the first substrate, an electron beam, an acoustic wave, and combinations thereof.

This release layer can be provided on the first substrate either in advance of the practice of the method of the present invention, or it may be provided as a part of the continuous process. Coating the first substrate with the release layer can be accomplished by any suitable method, including, but not limited to roll coating, conventional physical vapor deposition techniques, spin coating, organic vapor phase deposition, printing techniques, and PML.

In certain configurations of the present invention, it may be advantageous to provide a stencil mask between the first substrate and the second substrate. In this manner, more precise control of the predetermined pattern is achieved because the stencil mask assists in controlling where the thin film, non-polymeric materials are deposited on the second substrate.

Typically, the substrate is maintained at a temperature sufficiently high so that the liquid carrier does not condense on the first substrate, thus allowing the formation of a coating of the non-polymeric coating free of any of the liquid carrier. However, the same objective can also be accomplished by maintaining the first substrate at a temperature sufficiently high so that any liquid carrier that might initially condense upon contact with the first substrate quickly evaporates. Alternatively, by maintaining the first substrate at a temperature sufficiently low to allow both the liquid carrier and the non-polymeric compound to condense on the first substrate at the exit slit of the evaporation box, and subsequently increasing the temperature of the first substrate to a temperature sufficient to cause the liquid carrier to evaporate, a coating of the non-polymeric compound free of any of the liquid carrier is likewise formed.

Under either approach, the goal is to produce a coating of the non-polymeric coating substantially free of any of the liquid carrier on the first substrate. In this manner, the liquid carrier may be captured, allowing the subsequent re-use of the liquid carrier to provide additional mixture of the non-polymeric compound with the liquid carrier. Capturing the liquid carrier is easily accomplished by providing a cold trap in front of a pump used to provide the vacuum use to condense the liquid carrier.

DETAILED DESCRIPTION OF THE PRESENT INVENTION

Figure 1:
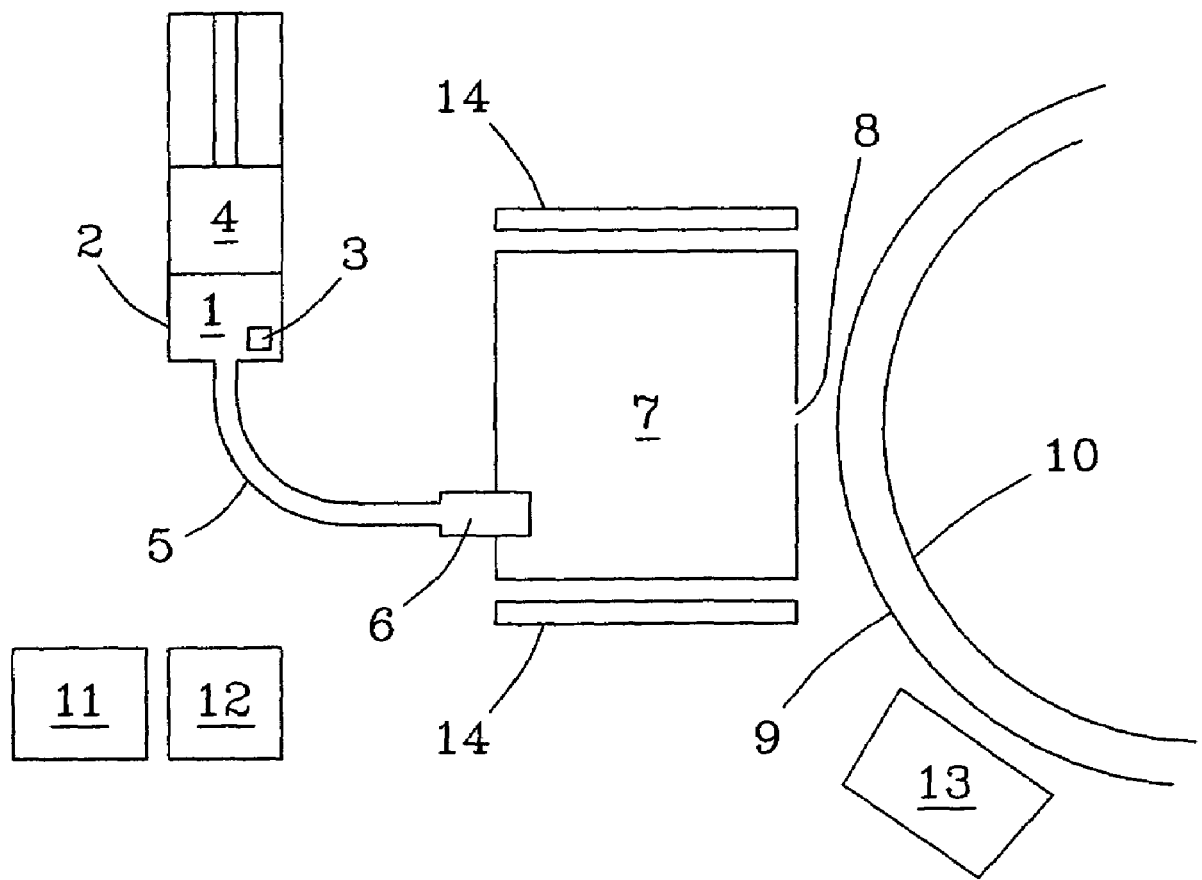
FIG. 1 is a schematic drawing showing that portion of the apparatus for the process of depositing the thin film, non-polymeric materials to the first substrate.

The portion of the apparatus of the present invention where thin film, non-polymeric materials are deposited on the first substrate is shown in FIG. 1. As shown in the figure, the mixture of the non-polymeric compound and liquid carrier 1 is maintained in a reservoir 2 having a syringe pump 4. Within reservoir 2 there is preferably a means 3 for agitating the mixture, including but not limited to an ultrasonic agitation, mechanical vibration, and magnetic stirring, employed to maintain the mixture as homogeneous. When pump 4 is pushed, the mixture 1 is directed down capillary 5, preferably towards an ultrasonic tip, or fuel injector 6. Mixture 1 is thereby injected into evaporation box 7 through the ultrasonic tip, or fuel injector 6 in an atomized form. The interior of the evaporation box 7 is maintained at a temperature sufficient to maintain the non-polymeric compound and the liquid carrier in a gaseous state by a heating means. While not meant to be limiting, the heating means could include resistive coils 14 as shown in the figure. Liquid carrier and non-polymeric compound 1 exits the evaporation box 7 in a gaseous state through an exit slit 8 whereupon the non-polymeric compound is preferably condensed upon a moving first substrate 9. While not meant to be limiting, the moving first substrate may be provided on a web roller 10. The web roller is maintained in a vacuum, created with a pump 11. The liquid carrier may be captured, allowing the subsequent use of the liquid carrier to provide additional mixture of the non-polymeric compound with the liquid carrier, for example by providing a cold trap 12 in front of a pump to condense and recycle the liquid carrier.

Figure 2:
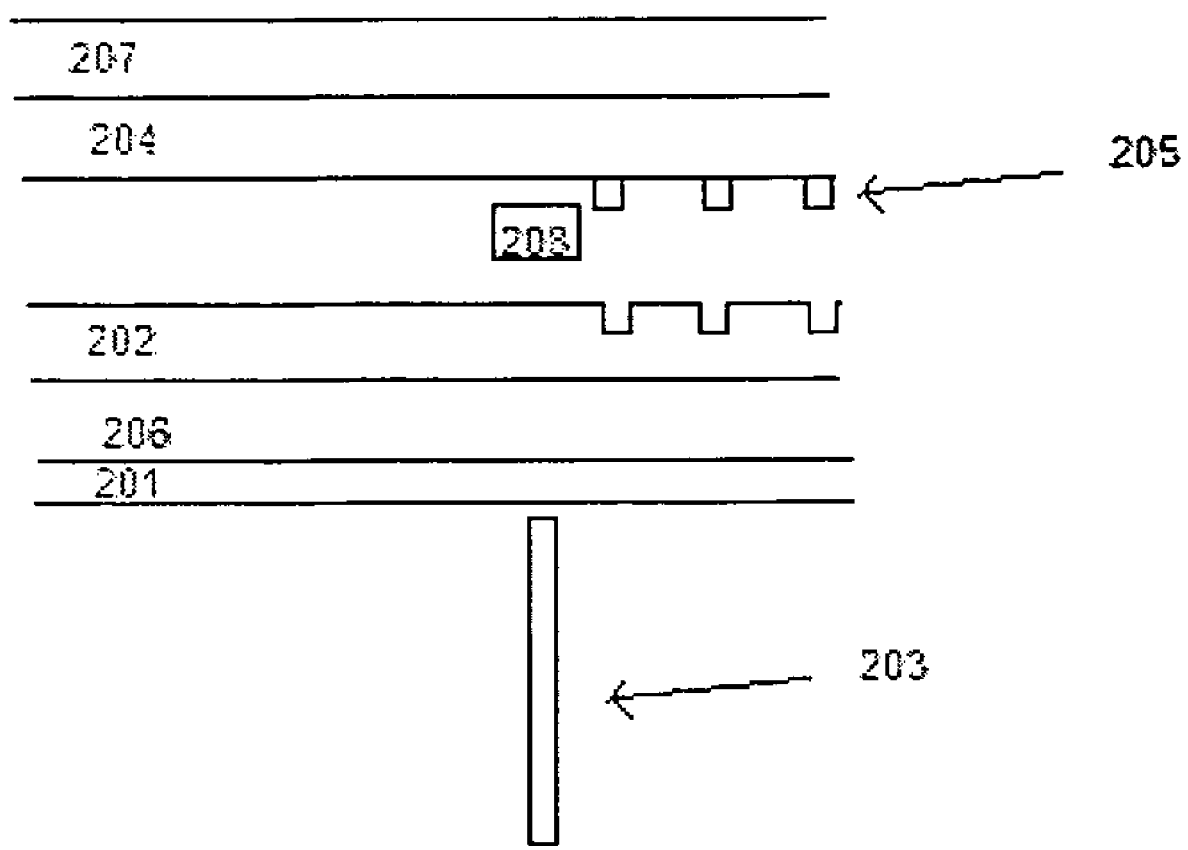
FIG. 2 is a schematic drawing showing that portion of the apparatus of the present invention where an energy source is directed toward the first substrate, thereby removing a portion of said non-polymeric compound from the first substrate and depositing the removed non-polymeric compound onto a second substrate in a predetermined pattern.
Figure 3:
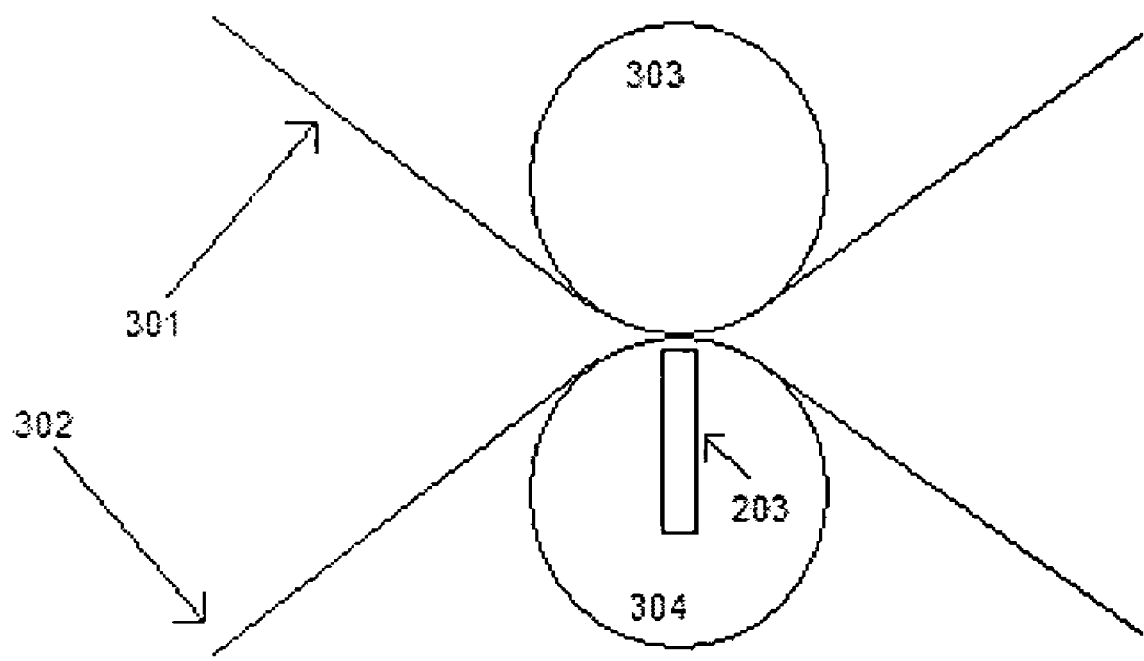
FIG. 3 is a schematic drawing showing an embodiment of the present invention where the first substrate and the second substrate are provided as flexible substrates and are brought into proximity with one and another using web rollers.

The portion of the apparatus of the present invention where an energy source is directed toward the first substrate, thereby removing a portion of said non-polymeric compound from the first substrate and depositing the removed non-polymeric compound onto a second substrate in a predetermined pattern, is shown in FIG. 2. As shown in the figure, the first substrate 201 is optionally coated first with a release layer 206 and then the non-polymeric compound 202 are exposed to an energy source 203. A portion 205 of the non-polymeric compound 202 is thereby removed from the first substrate 201 and is then deposited on the second substrate 204. By moving the first substrate 201 and the second substrate 204 past the energy source 203, repeated applications of energy can be supplied, thereby forming a pattern of the portions 205 of the non-polymeric compound 202 on the second substrate 204. A stencil mask 208 may be provided between the first substrate 201 and the second substrate 204 to provide more precise control of the predetermined pattern. Either or both of the first substrate 201 and the second substrate 204 can be mounted one or more rigid plates 207, to move them past the energy source 203, or, as shown in FIG. 3, either or both may be provided flexible substrates 301, 302 on a web rollers 303, 304. Without limiting the present invention, the energy source 203 can be placed inside one of the web rollers, allowing the application of energy at the point at which the first substrate 301 is brought into contact with the second substrate 302. Alternative arrangements would include, but not be limited to arrangements where the first substrate is on a free span between two adjacent web rollers with the energy source positioned in the gap therebetween and the second substrate is positioned above the free span, and arrangements where either or both of the first substrate and second substrate are tensioned around a single roller.

CLOSURE

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

The invention claimed is:

1. A method for coating a pattern of a thin film of a non-polymerizable compound on a substrate comprising the steps of:
  a. providing a mixture of said non-polymerizable compound and a liquid carrier,
  b. pumping said mixture to the interior of a heated evaporation box,
  c. exposing said mixture to a temperature within said heated evaporation box sufficient to convert substantially all of said non-polymerizable compound and liquid carrier to a gaseous form,
  d. removing said non-polymerizable compound and liquid carrier in said gaseous form through an exit slit in said evaporation box,
  e. condensing said non-polymerizable compound on a first substrate maintained in a vacuum and in motion relative to said exit slit in said evaporation box,
  f. directing an energy source to said first substrate, thereby removing a portion of said non-polymerizable compound from said first substrate, and
  g. depositing said removed non-polymerizable compound onto a second substrate in a predetermined pattern.

2. The method of claim 1 further comprising the step of maintaining the first and second substrates in physical contact when the portion of the non-polymerizable compound is removed from said first substrate and deposited on said second substrate.

3. The method of claim 1 further comprising the step of maintaining the first substrate at a temperature sufficiently high so that the liquid carrier does not condense on the first substrate.

4. The method of claim 1 further comprising the step of maintaining the substrate at a temperature sufficiently high so that any liquid carrier in contact with the substrate evaporates.

5. The method of claim 1 further comprising the steps of
  a. maintaining the substrate at a temperature sufficiently low to allow both the liquid carrier and the non-polymerizable compound to condense on the substrate at the exit slit of the evaporation box and
  b. subsequently increasing the temperature of the substrate to a temperature sufficient to cause the liquid carrier to evaporate.

6. The method of claim 1 wherein said first and second substrates are selected from the group of flexible substrates on a web roller, one or more discrete substrates on rigid plates, and combinations thereof.

7. The method of claim 1 wherein the non-polymerizable compound is selected as one or more organic materials.

8. The method of claim 1 wherein the non-polymerizable compound is selected as one or more inorganic materials.

9. The method of claim 1 wherein the non-polymerizable compound is selected as a mixture of organic and inorganic materials.

10. The method of claim 1 wherein said mixture is atomized into a fine spray inside of said evaporation box.

11. The method of claim 1 further comprising the step of providing a release layer on said first substrate.

12. The method of claim 1 further comprising the step of providing a stencil mask between said first substrate and said second substrate to provide precise control of said predetermined pattern.

13. The method of claim 1 further comprising the step of agitating the mixture in a source reservoir prior to introducing the mixture to the evaporation box.

14. The method of claim 13 wherein said agitation is provided by ultrasonic agitation, mechanical vibration, magnetic stirring, and combinations thereof.

* * * * *